US008723154B2

(12) United States Patent
Jo et al.

(10) Patent No.: US 8,723,154 B2
(45) Date of Patent: May 13, 2014

(54) INTEGRATION OF AN AMORPHOUS SILICON RESISTIVE SWITCHING DEVICE

(75) Inventors: Sung Hyun Jo, Sunnyvale, CA (US); Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 12/894,057

(22) Filed: Sep. 29, 2010

(65) Prior Publication Data

US 2012/0074507 A1    Mar. 29, 2012

(51) Int. Cl.
*H01L 29/12*      (2006.01)
*H01L 29/8605*   (2006.01)
*H01L 27/105*    (2006.01)
*H01L 21/8239*   (2006.01)

(52) U.S. Cl.
USPC    257/4; 257/379; 257/E27.121; 257/E27.085; 438/238

(58) Field of Classification Search
None
See application file for complete search history.

(56) References Cited

U.S. PATENT DOCUMENTS

| | | | | |
|---|---|---|---|---|
| 4,453,306 A * | 6/1984 | Lynch et al. | .................. | 438/301 |
| 5,360,981 A * | 11/1994 | Owen et al. | ....................... | 257/4 |
| 5,751,012 A * | 5/1998 | Wolstenholme et al. | .......... | 257/5 |
| 6,801,448 B2 * | 10/2004 | Hsu | ............................... | 365/148 |
| 7,042,757 B2 * | 5/2006 | Perner | ........................... | 365/158 |
| 7,061,071 B2 * | 6/2006 | Gilton | ............................ | 257/529 |
| 7,425,724 B2 * | 9/2008 | Aratani et al. | .................. | 257/68 |
| 7,933,136 B2 * | 4/2011 | Carter et al. | ..................... | 365/63 |
| 7,952,909 B2 * | 5/2011 | Inoue et al. | ..................... | 365/148 |
| 8,058,636 B2 * | 11/2011 | Osano et al. | ....................... | 257/2 |
| 8,071,972 B2 * | 12/2011 | Lu et al. | ............................ | 257/5 |
| 8,139,392 B2 * | 3/2012 | Hosoi | ............................ | 365/148 |
| 8,144,499 B2 * | 3/2012 | Kitagawa et al. | ............. | 365/148 |
| 2009/0250678 A1 * | 10/2009 | Osano et al. | ....................... | 257/2 |
| 2009/0310425 A1 * | 12/2009 | Sim et al. | ................. | 365/185.29 |
| 2010/0080037 A1 * | 4/2010 | Inoue et al. | ..................... | 365/148 |
| 2010/0142245 A1 * | 6/2010 | Kitagawa | ....................... | 365/51 |
| 2010/0214818 A1 * | 8/2010 | Kitagawa et al. | ............. | 365/148 |
| 2011/0140069 A1 * | 6/2011 | Inoue | ................................ | 257/5 |
| 2011/0229990 A1 * | 9/2011 | Kreupl et al. | ................... | 438/17 |

OTHER PUBLICATIONS

A.J. Snell, P.G. Lecomber, J. Hajto, M.J. Rose, A.E. Owen, I.S. Osborne, Analogue memory effects in metal/a-Si:H/Metal memory devices, Journal of Non-Crystalline Solids, vols. 137-138, Part 2, 1991, pp. 1257-1262.*

Hu, J., et. al. "AC Characteristics of Cr/p/sup +/ A-Si:H/V Analog Switching Devices." IEEE Transactions on Electron Devices 47.9 (2000): 1751.*

(Continued)

*Primary Examiner* — Thomas L Dickey
*Assistant Examiner* — Joseph Schoenholtz
(74) *Attorney, Agent, or Firm* — Ogawa P.C.

(57) ABSTRACT

An integrated circuit device. The integrated circuit device includes a semiconductor substrate having a surface region. A gate dielectric layer overlies the surface region of the substrate. The device includes a MOS device having a $p^+$ active region. The $p^+$ active region forms a first electrode for a resistive switching device. The resistive switching device includes an amorphous silicon switching material overlying the $p^+$ active region and a metal electrode overlies the first metal conductor structure. The metal electrode includes a metal material, upon application of a positive bias to the metal electrode, forms a metal region in the amorphous silicon switching material. The MOS device provides for a select transistor for the integrated circuit device.

43 Claims, 15 Drawing Sheets

(56) References Cited

OTHER PUBLICATIONS

Owen, A.E.; Hu, J.; Hajto, J.; Snell, A.J.; , "Electronic switching in amorphous silicon devices: properties of the conducting filament," Solid-State and Integrated Circuit Technology, 1998. Proceedings. 1998 5th International Conference on , vol., No., pp. 830-833, 1998.*

Owen, A.E.; Comber, P.G. Le; Sarrabayrouse, G.; Spear, W.E.; , "New amorphous-silicon electrically programmable nonvolatile switching device," Solid-State and Electron Devices, IEE Proceedings I , vol. 129, No. 2, pp. 51-54, Apr. 1982.*

W.B. Jackson, R. Elder, W. Hamburgen, A. Jeans, H.-J. Kim, H. Luo, P. Mei, C. Perlov, C. Taussig, H. Branz, P. Stradin, Q. Wang, S. Ward, S. Braymen, F. Jeffery, Amorphous silicon memory arrays, Journal of Non-Crystalline Solids, vol. 352, Issues 9-20, Jun. 15, 2006, pp. 859-862.*

Tilo P. Drüsedau, Andreas N. Panckow, Frank Klabunde, The hydrogenated amorphous silicon/nanodisperse metal (Simal) system—films of unique electronic properties, Journal of Non-Crystalline Solids, vols. 198-200, Part 2, May 2, 1996, pp. 829-832.*

Sung Hyun Jo, Kuk-Hwan Kim and Wei Lu, Nano Lett., 2009, 9 (2), pp. 870-874.*

Avila, A., and R. Asomoza. "Switching in Coplanar Amporphous Hydrogenated Silicon Devices." Solid State Electronics 44 (2000): 17-27.*

Jo, Sung Hyun. Nanoscale Memristive Devices for Memory and Logic Applications. Thesis. University of Michigan, 2010.*

Dey, S.K., Electrothermal model of switching in amorphous silicon films, J. Vac. Sci. Technol. 17, 445 (1980).*

Definition of adjacent downloaded from URL < http://www.thefreedictionary.com/adjacent> on Oct. 27, 2012.*

Jo, Sung Hyun, and Wei Lu. "CMOS Compatible Nanoscale Nonvolatile Resistance Switching Memory." Nano Letters 8.2 (2008): 392-97.*

Dey, S.K. Conduction Processes and Threshold Switching in Amorphous Si Films, J. Vac. Sci. Technol. 16, 240 (1979).*

* cited by examiner

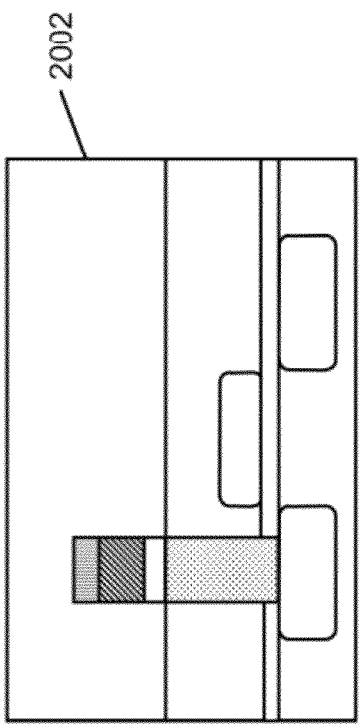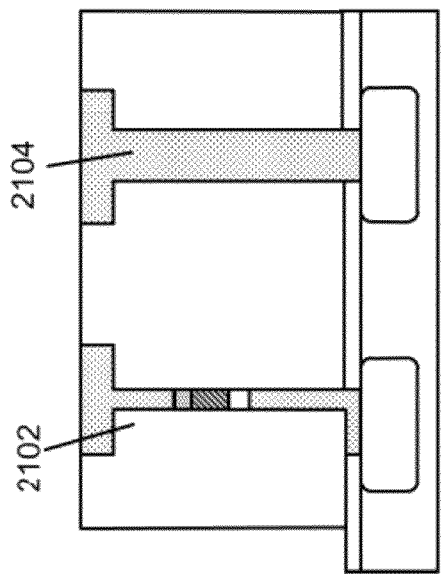

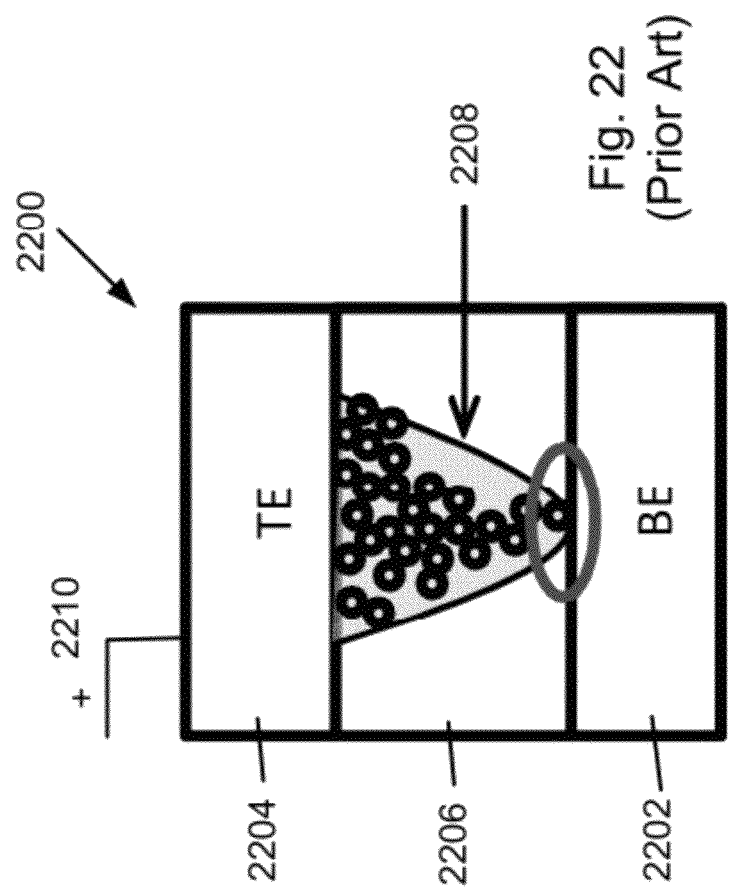

INTEGRATION OF AN AMORPHOUS SILICON RESISTIVE SWITCHING DEVICE

CROSS REFERENCE TO RELATED APPLICATIONS

Not Applicable

STATEMENT RELATED TO FEDERAL OR GOVERNMENT SPONSORED RESEARCH

Not Applicable

BACKGROUND

The present invention is generally related to resistive switching devices. More particularly, embodiments according to the present invention provide a method and a structure for integrating a resistive switching device with a transistor for switching control. The present invention can be applied to non-volatile resistive switching memory device. But it should be recognized that the present invention can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching for a PCRAM device requires large amounts of power. Organic RAM is incompatible with large volume silicon-based fabrication and device reliability is usually poor.

From the above, an improved semiconductor device is desirable.

BRIEF SUMMARY OF THE PRESENT INVENTION

The present invention is generally related to resistive switching devices. More particularly, embodiments according to the present invention provide a method and a structure for integrating a resistive switching device with a transistor for switching control. The present invention can be applied to non-volatile resistive switching memory device. But it should be recognized that the present invention can have a much broader range of applicability.

In a specific embodiment, a method of forming an integrated circuit device is provided. The integrated circuit device includes at least a resistive switching device and a MOS transistor to form a one transistor one resistor (or 1T1R) configuration. In a specific embodiment, the integrated circuit device includes a semiconductor substrate having a surface region and a gate dielectric layer overlying the surface region of the substrate. A MOS device forms on the semiconductor substrate. The MOS device includes a gate structure, a first active region, and a second active region. As merely an example, the first active region can be a first impurity region in the semiconductor substrate and provides for a source region for the MOS device. The second active region can be a second impurity region in the semiconductor substrate and provides for a drain region for the MOS device. A first conductor structure overlies the first active region. The integrated circuit device includes a resistive switching device. The resistive switching device includes a first electrode overlying the first conductor structure; a switching region overlies the first electrode and a second electrode comprising at least a conductive material overlying the switching region. The switching region includes an amorphous silicon material in a specific embodiment. The conductive material is configured to be in contact with the switching region. The integrated circuit device includes a second conductor structure overlying the second active region of the MOS device.

In an alternative embodiment, an integrated circuit device is provided. The integrated circuit device structure provides an alternative 1T1R implementation according to a specific embodiment. The integrated circuit device includes a semiconductor substrate having a surface region and a gate dielectric layer overlying the surface region of the substrate. A MOS device forms on the semiconductor substrate. The MOS device includes a gate structure, a first $p^+$ active region, and a second $p^+$ active region to form a PMOS device in a specific embodiment. The integrated circuit device includes a resistive switching device. The resistive switching device includes a switching region overlying the first $p^+$ active region and a second electrode comprising at least a conductive material overlying the switching region. The switching region includes an amorphous silicon material in a specific embodiment. The conductive material is configured to be in contact with the switching region. The integrated circuit device includes a second conductor structure overlying the second active region.

In a yet alternative embodiment, an integrated circuit device structure is provided. The alternative 1T1R implementation according to a specific embodiment. The integrated circuit device includes a semiconductor substrate having a surface region and a gate dielectric layer overlying the surface region of the substrate. A MOS device forms on the semiconductor substrate. The MOS device includes a gate structure, a first active region, and a second active region. A first conductor structure overlies the first active region. The integrated circuit device includes a resistive switching device. The resistive switching device includes a switching region overlying the first conductor structure and a second electrode comprising at least a conductive material overlying the switching region. The switching region includes an amorphous silicon material in a specific embodiment. The conductive material is configured to be in contact with the switching region. The integrated circuit device includes a second conductor structure overlying the second active region.

Many benefits can be achieved by ways of the present invention over convention techniques. For example, embodiments according to the present invention provide a device structure for a one transistor one resistor (1T1R) implementation illustrated in FIG. 3. Depending on the embodiment, the transistor can be used as a select transistor for the switching device. In other embodiment, the transistor provides for a variable resistor Rs 330 coupled to the resistive switching device (memory element 320), allowing programming (for example, write, read, or erase) of the switching device at selected voltage to enable a multi bit storage capability for the resistive switching device. The variable resistance Rs 330 of the transistor can further control current flows to protect the resistive switching device. In other embodiments, the present invention provides a device structure and a method to form a one time programmable storage device having a stable data storage and excellent scalability.

Depending on the embodiment, one or more of these benefits may be achieved. One skilled in the art would recognize other variations, modifications, and alternatives.

SUMMARY OF THE DRAWINGS

FIGS. 16-21 are simplified diagrams illustrating an alternative method of forming an integrated one transistor and one resistor device according to an embodiment of the present invention.

FIG. 22 is a simplified diagram illustrating a method of forming a conventional one time programmable device.

DETAILED DESCRIPTION OF THE PRESENT INVENTION

The present invention is generally related to resistive switching devices. More particularly, embodiments according to the present invention provide a method and a structure for integrating a resistive switching device with a transistor for switching control. The present invention can be applied to non-volatile resistive switching memory device. But it should be recognized that the present invention can have a much broader range of applicability.

Figure 1:
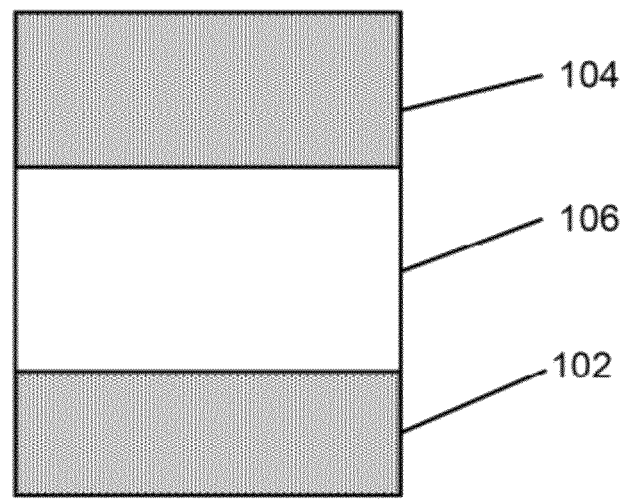
FIG. 1 is a simplified diagram illustrating a switching device.

FIG. 1 is a simplified diagram illustrating a resistive switching device according to an embodiment of the present invention. As shown, the resistive switching device includes a first electrode 102, a second electrode 104, and a switching material 106 sandwiched between the top electrode and the bottom electrode. The switching material is configured to change in resistance when a voltage is applied to the first electrode or the second electrode. The first electrode and the bottom electrode can include one or more conductive materials. The one or more conductive materials can include at least a portion, commonly used in CMOS fabrication, for example, a metal or polysilicon material. Depending on the embodiment, the switching material can comprise a chalcogenide material, a solid electrolyte material, an amorphous silicon material depending on the application. The chalcogenide material, for example, a metal oxide material is characterized by one or more metal deficient sites or one or more oxygen deficient sites. When a voltage is applied to the first electrodes or the second electrode, the metal deficient sites or the oxygen deficient site are caused to move from one electrode to the other and a current flows. Examples of such metal oxide materials can include titanium oxide, tungsten oxide, copper oxides, nickel oxide, and others. In a specific embodiment, the resistive switching device can have a metal material as the top electrode, an amorphous silicon as the switching material, and a $p^+$ silicon material as the bottom electrode. The metal materiel can be silver, platinum, gold, aluminum, palladium, nickel, tungsten or titanium. The metal material should have appropriate diffusion characteristic in the amorphous silicon material so that proper switching behavior can occur at a reasonably low voltage. The bottom electrode formed from a $p^+$ silicon material can be, for example, an active region of a transistor. Such configuration is particular useful in an one transistor one resistor (1T1R) integration for a memory device. For example, this 1T1R implementation can have the advantage of fast operation resulting from a low parasitic resistance as well as low parasitic capacitance. Additionally, a high density array can be made possible by a low leakage current in the resistive switching device and rectifying switching, which limits an operating current to flow in only one predetermined direction, is therefore not needed.

Figure 2:
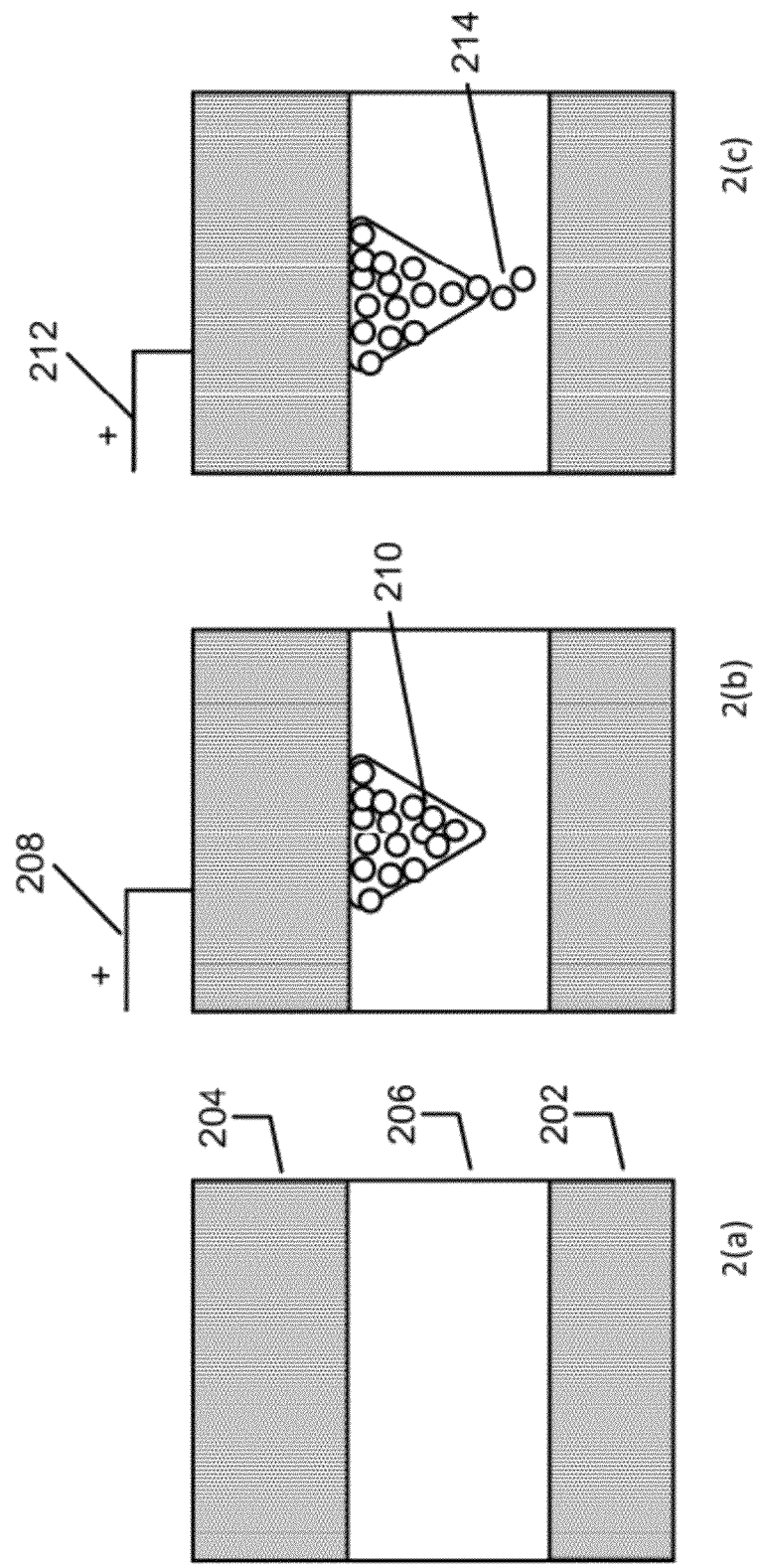
FIG. 2 illustrates formation of a conductor region in a switching device according to an embodiment of the present invention.

As illustrated in FIG. 2, programming of a switching device is illustrated. The switching device is exemplified using a metal/amorphous silicon/$p^+$ silicon configuration. As shown in 2(*a*), an as fabricated switching device is provided. The switching device includes a first electrode 202, a second electrode 204 and a switching region 206 including an amorphous silicon material sandwiched between the first electrode and the second electrode. The second electrode can have a first portion that includes a metal material such as silver, gold, platinum, palladium, and others. The second electrode also has a second portion that forms a wiring structure for the device. In a specific embodiment, the first electrode can include a $p^+$ silicon material. The $p^+$ silicon material can be formed form single crystal silicon or polysilicon, depending on the application. As shown in 2(*b*), when a first positive voltage 208 is applied to the second electrode, a metal region 210 comprising metal particles formed from the metal material is formed in a region near the first electrode. The switching device is in a low resistance state and only a small amount of current flows through the device. To program the device, a second positive voltage 212 is applied to the second electrode as shown in 2(*c*). The second positive voltage causes a metal filament 214 to form. The metal filament is characterized by a length that depends on amplitude of the second positive voltage. The length of the metal filament determines a resistance state of the amorphous silicon material. The high resistant state and the low resistant state allow for a programmable resistor, for example high resistance=logic 1 and low resistance=logic 0 or vice versa. Of course one skilled in the art would recognize other modifications, variations, and alternatives.

Figure 3:
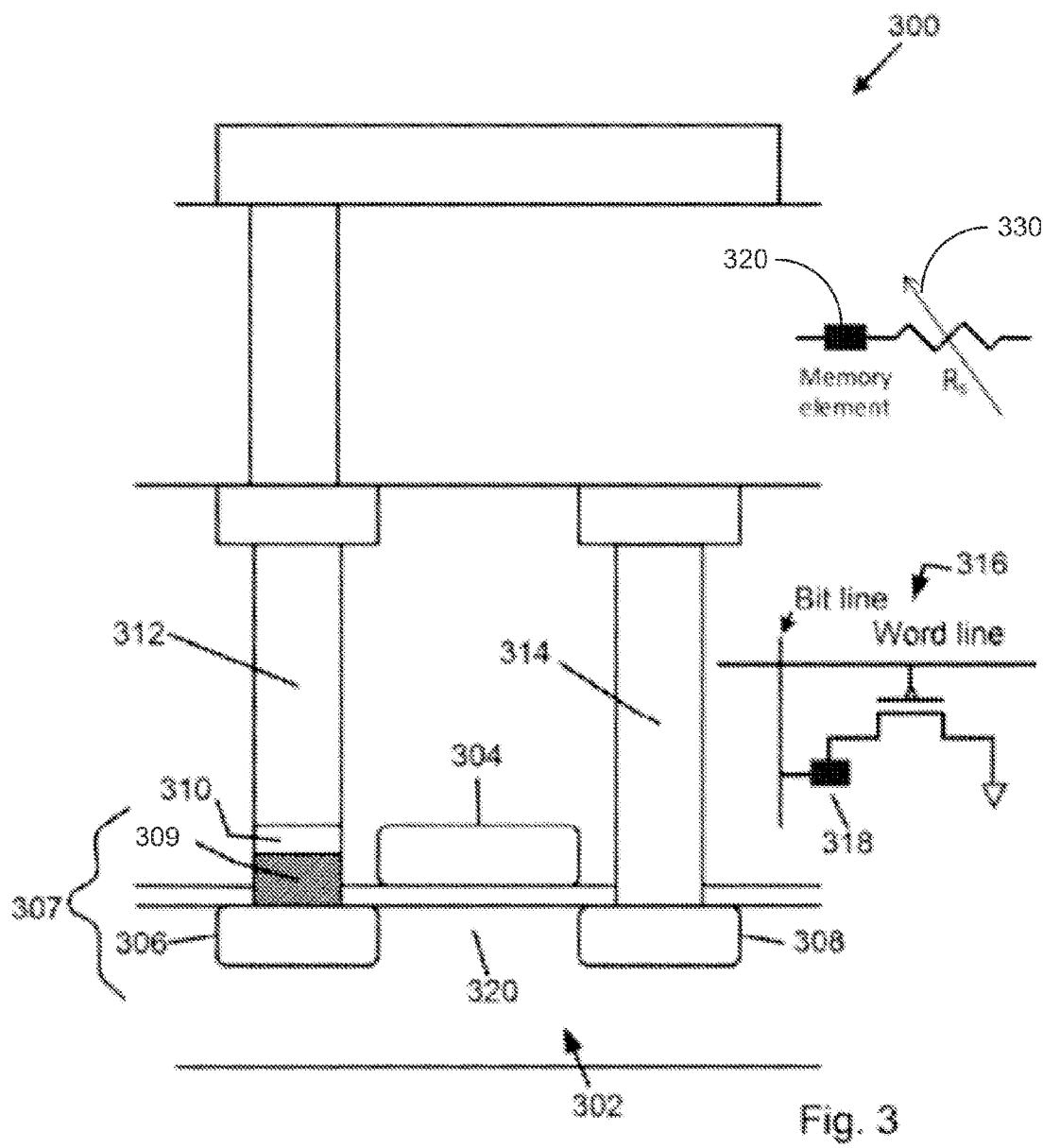
FIG. 3 is a simplified diagram illustrating an integrated one transistor and one resistor device according to an embodiment of the present invention.

FIG. 3 is an exemplified diagram illustrating a memory device 300 using a 1T1R implementation according to an embodiment of the present invention. As shown, the memory device includes a transistor 302, for example a MOSFET. The transistor includes a gate structure 304, which can function as a word line for the memory device. The gate structure can be a polysilicon gate or a metal gate depending on the embodiment. The transistor includes a first active region 306 and a second active region 308. In a specific embodiment, the first active region and the second active region each has a p+ impurity type characteristic to provide for a PMOS device. The p+ impurity can be provided by a boron species at a concentration ranging from about 10e 18 per cm$^3$ to about 10e21 per cm$^3$ in a specific embodiment. As shown in FIG. 3, the memory device includes a switching device 307. The switching device includes a switching region 309 overlying the first active region. The switching region comprises an amorphous silicon material in a specific embodiment. In a specific embodiment, the first active region provides for a first electrode for the switching device using amorphous silicon material as the switching medium in a specific embodiment. The amorphous silicon material is characterized by a plurality of defects sites caused by silicon dangling bonds, atomic dislocation, or crystal plane dislocation in a specific embodiment. As shown, the switching device includes a second electrode 310 overlying the switching region. The second electrode includes a metal material having certain desirable characteristics. For example, the metal material has a diffusivity characteristic that under an electric field or upon application of a thermal energy, a plurality of conductor particles from the material are formed in the defect sites of the amorphous silicon material. The plurality of conductive particles form a metal region in a vicinity of the second electrode in a specific embodiment. The number of defect sites in the amorphous silicon material may be controlled by deposition process and process parameters to provide desirable switching behavior of the resistive switching device depending on the application.

In a specific embodiment, the metal region further includes a filament structure that can extend or retract depending on a voltage applied to the first electrode or the second electrode (see for example, 2(c) in FIG. 2). The filament structure determines a resistance of the amorphous silicon material and switching characteristic of the switching device in a specific embodiment. The second electrode can include metal materials such as silver, gold, platinum, palladium, or aluminum, or alloys formed these metals depending on the application. In a specific implementation, the second electrode includes a silver material for amorphous silicon as switching material.

Also shown in FIG. 3, the memory device includes a first conductor structure 312 overlying the second electrode to form a bit line for the resistive switching device. A second conductor structure 314 overlies the second active region of the transistor. An exemplified circuit representation of the device 316 is shown. As shown, the gate structure, the first active region, and the second active region form a transistor device in a specific embodiment. The gate structure provide for a word line for the switching device in a specific embodiment. The resistive switching device 318 comprises a first electrode formed from an active region of the transistor allows easy integration of the transistor with the switching device.

In a specific embodiment, the transistor can be a select transistor for the resistive switching device in a memory array. For example, when the word line is selected by applying a gate voltage to the gate structure, charges are formed in channel region 320 causing the first active region to be electrically connected to the second active region through channel region 320. The memory device can be programmed (read, write or erase) by applying a suitable respective bias voltage to bit line 312 in a specific embodiment.

Besides functioning as a select transistor, transistor 302 can be used to control programming current of the switching device. As channel resistance of the transistor can vary depending on a bias voltage applied to gate structure 304, current flowing in the switching device can be controlled. In particular, the channel resistance controls a maximum allowable programming current to flow in the switching device thus prevent the switching device from failure during programming processes in a specific embodiment. Moreover, since the programming current of the switching device can be controlled by the gate voltage, multi-level bit capability can be realized.

Figure 4:
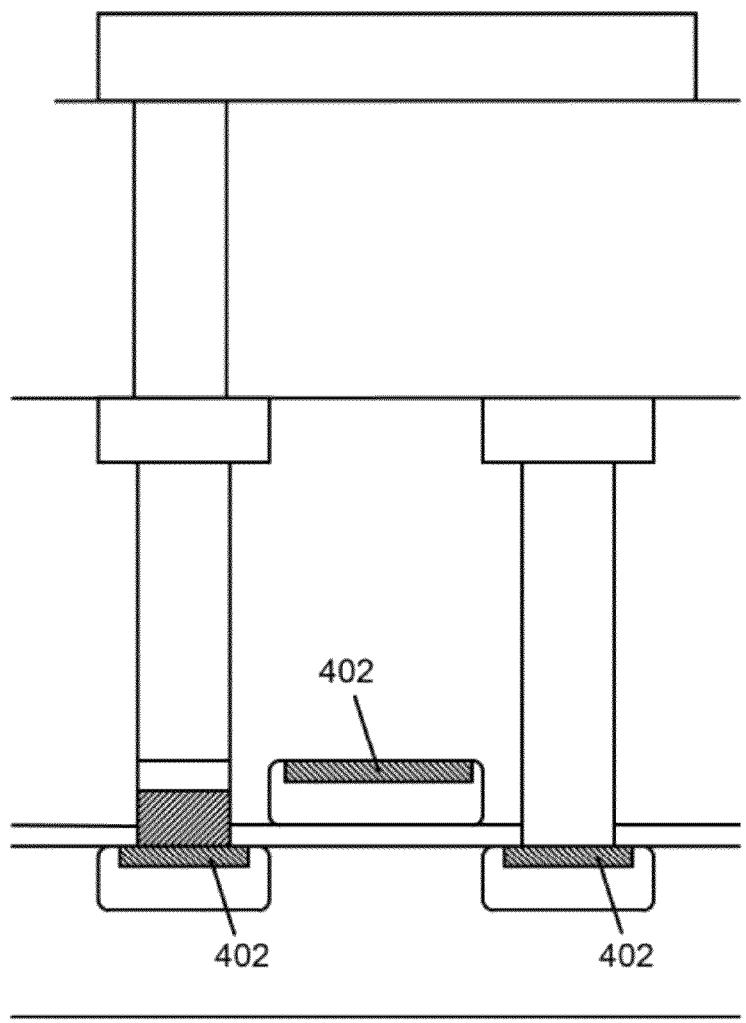
FIG. 4 is a simplified diagram illustrating an integrated one transistor and one resistor device according to an alternative embodiment of the present invention.

Depending on the application, there can be variations. For example, resistance of the gate structure can be reduced by using a silicide 402 as shown in FIG. 4. The silicide may be formed by depositing cobalt, nickel, tungsten, or other suitable metals onto the polysilicon surface and form an alloy upon heating or annealing. In other embodiments, the active regions may also be silicided to improve performance of the memory device.

Figure 5:
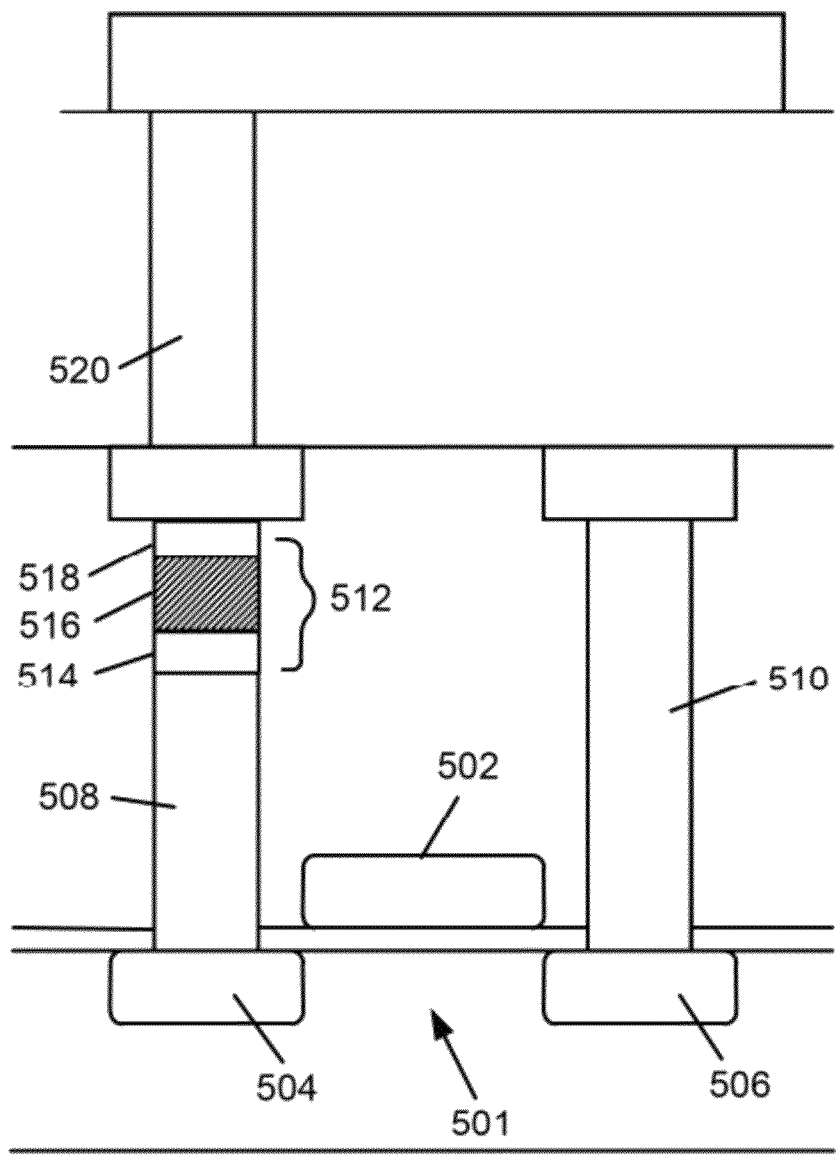
FIG. 5 is a simplified diagram illustrating an integrated one transistor and one resistor device according to an alternative yet embodiment of the present invention.
Figure 6:
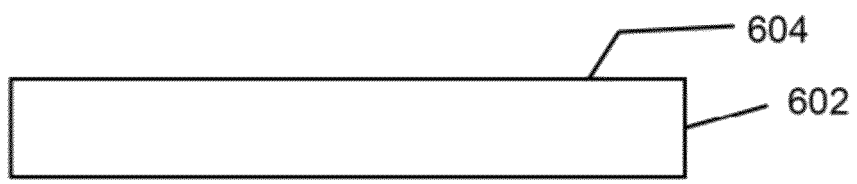
FIGS. 6-15 are simplified diagrams illustrating a method of forming an integrated one transistor and one resistor device according to an embodiment of the present invention.

FIG. 5 illustrates an alternative device structure using the 1T1R implementation according to an embodiment of the present invention. As shown, a transistor 501 is provided. The transistor includes a gate 502, a first active region 504, and a second active region 506. A first conductor structure 508 is coupled to the first active region, and a second conductor structure 510 is coupled to the second active region. The first conductor structure and the second conductor structure can be made of a suitable metal such as tungsten, copper, or aluminum, depending on the embodiment. This device configuration is not limited to a PMOS transistor; a NMOS transistor can also be used providing design flexibility. As shown, a switching device 512 includes a first electrode 514 overlying the first conductor structure and operably coupled to the first conductor structure. A switching region 516 comprising of amorphous silicon material overlies the first electrode. In a specific embodiment, the first electrode 514 can be a p+ polysilicon layer in FIG. 5. In certain embodiment, the p+ polysilicon layer 514 functions as a buffer layer to control interfacial property between the amorphous silicon switching layer and the metal first conductor structure. The buffer layer improves endurance of the switching device in a specific embodiment. Depending on the application, the buffer layer may be optional.

Referring again to FIG. 5, switching device 512 includes a second electrode 518 overlying the switching region. The second electrode can be silver, gold, palladium, aluminum, or other suitable materials. The second electrode is preferably characterized by a suitable diffusivity in the switching material. In a specific embodiment, the second electrode can formed from a silver material for an amorphous silicon switching material in a specific embodiment. The device includes a third conductor structure 520 overlying the second electrode. The third conductor structure provides for a bit line for the device in a specific embodiment.

Figure 7:
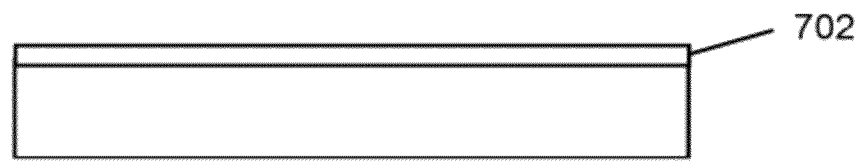

In a specific embodiment, a method of forming a switching device integrated with a transistor is provided. As shown in FIG. 6-16, the method includes providing a semiconductor substrate 602 having a surface region 604. The semiconductor substrate can be a single crystal silicon wafer, silicon on insulator, or silicon germanium, depending on the application. The method forms a gate dielectric layer 702 overlying the surface region as shown in FIG. 7. In a specific embodiment, the gate dielectric layer is usually a high quality silicon oxide such as a thermal oxide. Alternatively, the gate dielectric layer can be a silicon nitride or a dielectric stack such as silicon oxide on silicon nitride on silicon oxide stack (commonly known as ONO), or other suitable dielectric materials.

Figure 8:
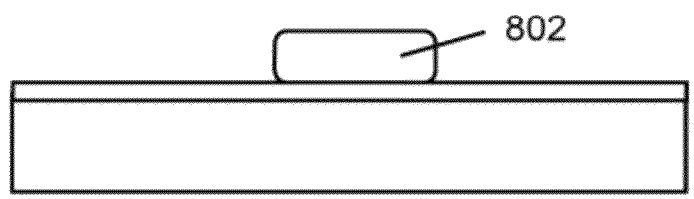

The method includes forming a gate structure 802 overlying the gate dielectric layer as shown in FIG. 8. The gate structure can be a polysilicon gate or a metal gate depending on the specific embodiment. The gate structure can be formed by depositing a polysilicon material overlying the gate dielectric layer and forming a mask overlying the polysilicon material to expose a portion of the polysilicon material. The method then performs an etching process to form the gate structure. The polysilicon gate can be doped in situ or ex situ depending on the application. The polysilicon gate can also be silicided to increase its conductivity in certain embodiments.

Figure 9:
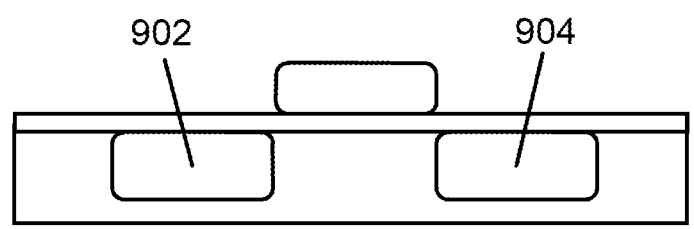

Referring to FIG. 9 the method forms a first active region 902 and a second active region 904 in a portion of the semiconductor substrate in a vicinity of the surface region of the semiconductor substrate. The first active region and the second active region can be formed using an implantation process using a suitable impurity species. The implantation process can use the gate structure as a mask for a self-aligned active regions in a specific embodiment. The implantation process can also dope the polysilicon gate in a specific embodiment. In a specific embodiment, the first active region and the second active region are $p^+$ doped using boron or aluminum or gallium as impurity species in a specific embodiment.

Figure 10:
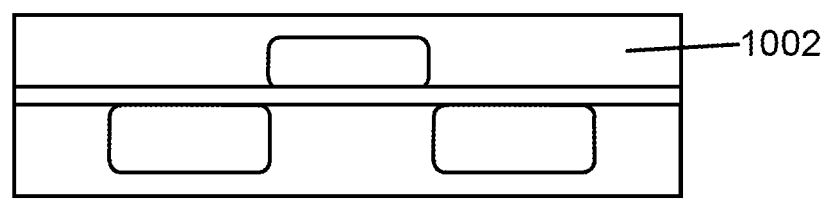

In a specific embodiment, the method forms a first interlayer dielectric material 1002 overlying the gate structure, the first active region, and the second region as show in FIG. 10. The first dielectric material can be silicon oxide formed using a chemical vapor deposition process, a spin on coating process or a combination thereof depending on the embodiment. In other embodiments, the first interlayer dielectric material can be silicon nitride, silicon oxynitride or an ONO stack. Of course one skilled in the art would recognize other modifications, variations, and alternatives.

Figure 11:
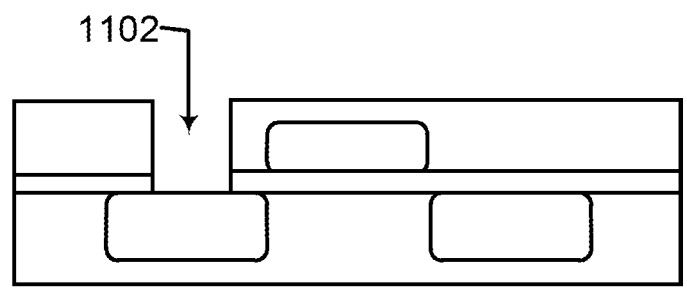
Figure 12:
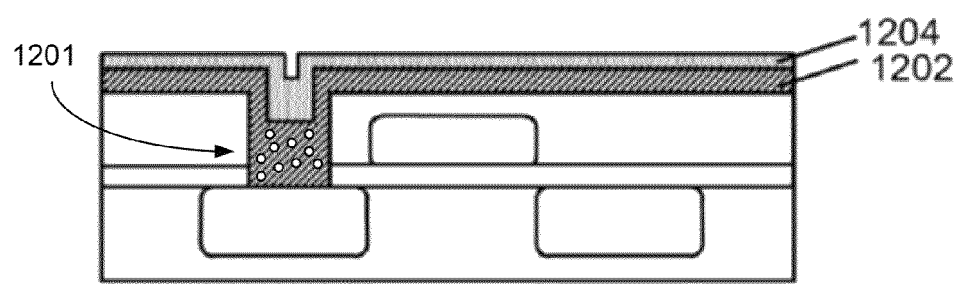
Figure 13:
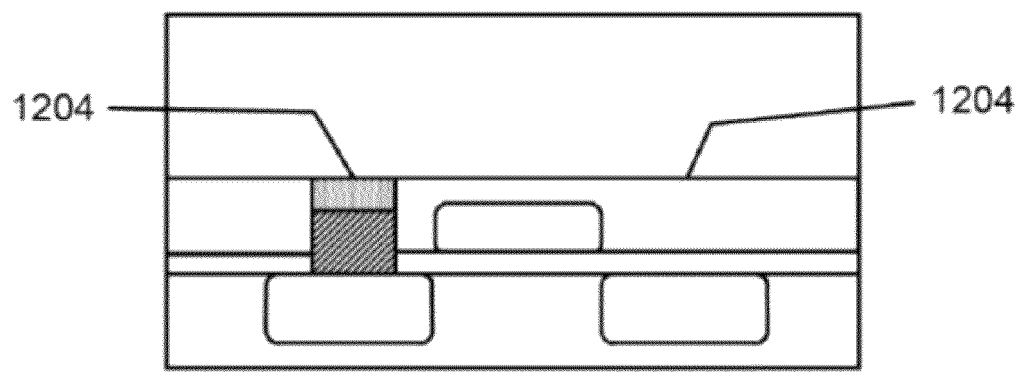
Figure 14:
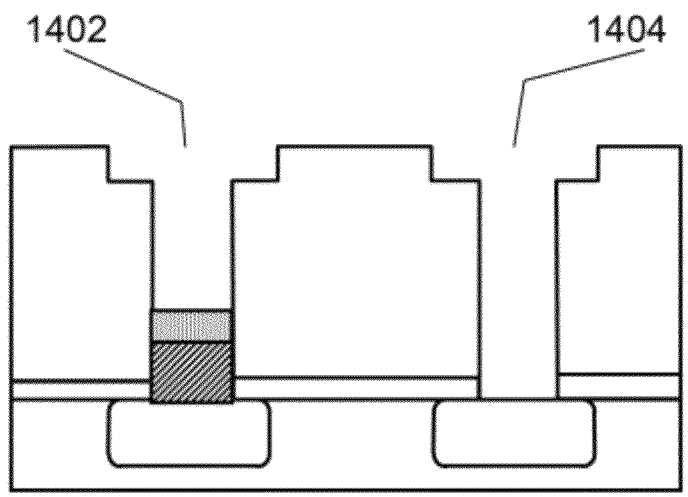

Referring to FIG. 11, the method includes subjects the first dielectric material to a first pattern and etching process to form a first opening 1102 in a portion of the first dielectric material to expose a surface portion of the first active region. As shown in FIG. 12, an amorphous silicon material 1202 is formed overlying at least the exposed portion of the first active region and a metal material 1204 is formed overlying the amorphous silicon material. In a specific embodiment, the amorphous silicon material can be deposited using techniques such as low pressure chemical vapor deposition or plasma enhanced chemical vapor deposition techniques using precursors such as silane, disilane, chlorosilane, or other suitable silicon precursors. Deposition temperature can range from about 250 Degree Celsius to about 600 Degree Celsius depending on the application. In a specific embodiment, the amorphous silicon material is characterized by a plurality of defect sites 1201 and a defect density. The plurality of defect sites can be caused by silicon dangling bonds, dislocations of atoms or molecules. In a specific embodiment, the defect sites and the defect density may be controlled by the process used or process parameters. The metal material can be silver, platinum, gold, palladium, and other suitable material for switching. In a specific embodiment, the metal material is silver deposited using techniques such as sputtering, evaporation, electrochemical method such as electroplating, electroless plating, or a combination of these and others, depending on the embodiment. In a specific embodiment, the metal material forms a metal region in a portion of the amorphous silicon material upon application of a suitable voltage as shown in FIG. 2.

In a specific embodiment, the metal material and the amorphous silicon are subjected to an etching process to form a planarized surface region and to isolate the metal material to form a second electrode structure and a switching element in a specific embodiment. As shown, the second electrode structure, the amorphous silicon material and the first active region form a resistive switching device in a specific embodiment.

In a specific embodiment, the method includes depositing a third dielectric layer overlying the top electrode structure and the second dielectric layer, which has been planarized. In a specific embodiment, the method includes forming a first via opening 1402 and a second via opening 1404 in a portion of the second dielectric. As shown, the first via opening includes an exposed surface region of the top electrode structure and the second via opening includes an exposed surface of the second active region in a specific embodiment. Each of the first via opening and the second via open can further include a trench opening for interconnects depending on the embodiment.

Figure 15:
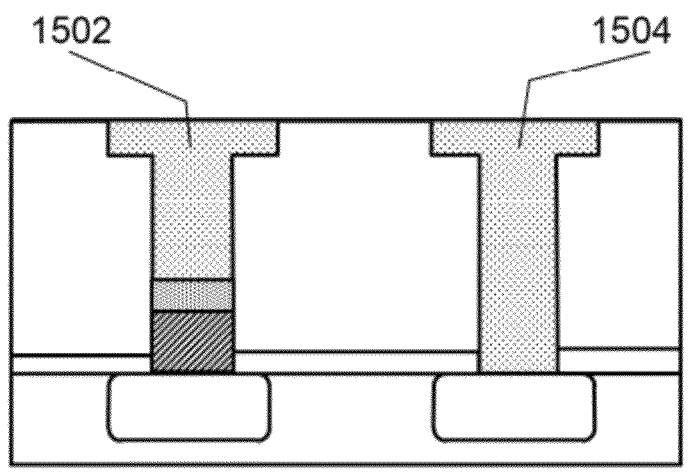
Figure 16:
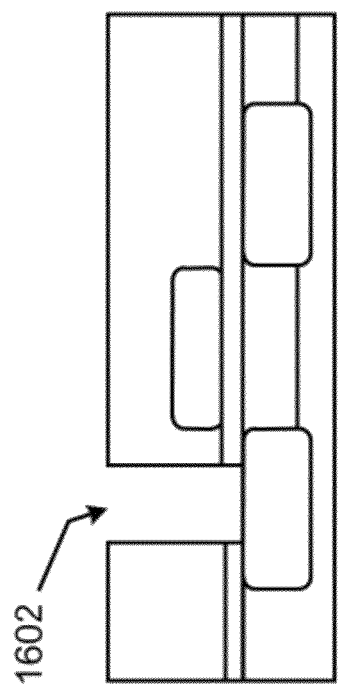

Referring to FIG. 15, the method fills the first via opening and the second via opening using a conductor material to form conductor 1502 and conductor 1504. In a specific embodiment, the conductor material can be copper, tungsten, or aluminum depending on the embodiment. The conductor material may include one or more adhesive layers or diffusion barrier to prevent delamination of the metal material or diffusion of metal material into other regions of the device in a specific embodiment.

The method forms a bit line structure to control the resistive switching device in a specific embodiment. For example, a bit line voltage controls resistance of the switching device and programming of the switching device while the transistor can be a select transistor depending on the implementation.

Figure 17:
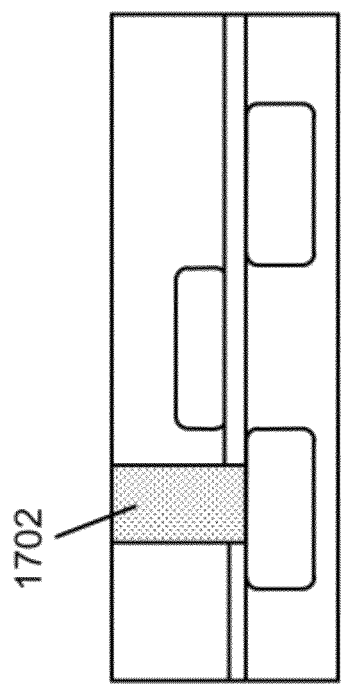

Depending on the MOS device used, there can be other alternatives. For example, the device can incorporate an NMOS device with the resistive switching device as illustrated in FIG. 5. To fabricate the device, a first opening 1602 is formed in a region of a first dielectric material, exposing the first active region. A conductive material 1702 such as tungsten, copper, or aluminum, commonly used in CMOS fabrication fills the opening region as shown in FIG. 17.

Figure 18:
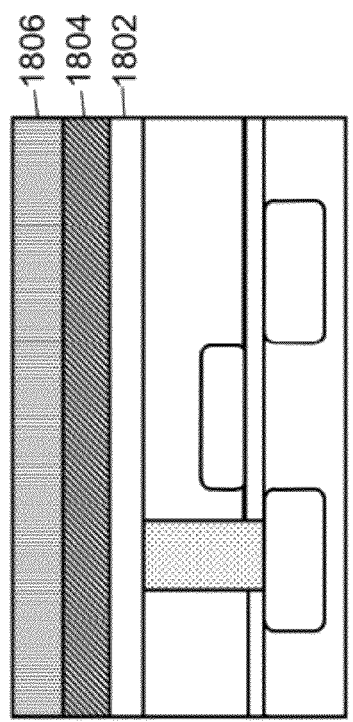
Figure 19:
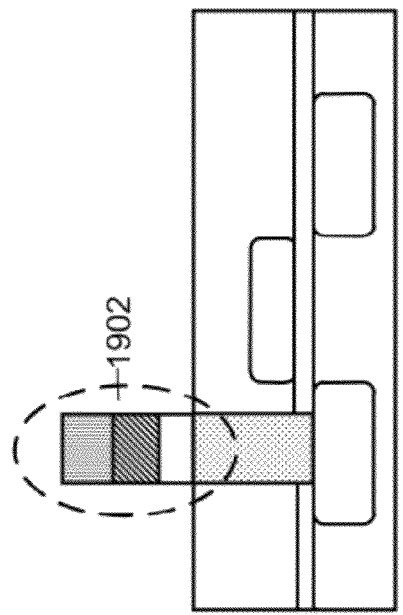

Referring to FIG. 18, a first electrode material comprising a $p^+$ polysilicon material 1802 is formed overlying at least the conductive material, a switching material 1804 comprising an amorphous silicon material is formed overlying the polysilicon material, and a second electrode material 1806 comprising, for example, a silver material is formed overlying the polysilicon material. The method then subjects the stack comprising the polysilicon material, the amorphous silicon material, and the silver material to a pattern and etch process to form a resistive switching device 1902 overlying the conductive material as shown in FIG. 19 in a specific embodiment. As shown, a $p^+$ polysilicon material is formed overlying the fist via structure, an amorphous silicon switching material is formed overlying the $p^+$ polysilicon material, and a top electrode is formed overlying the amorphous silicon material.

As shown in FIG. 20, a third dielectric material 2002 is formed overlying the switching device. The method forms a first via structure 2102 and a second via structure 2104 in a potion of the third dielectric material and the second dielectric layer as shown in FIG. 21. As shown, the first via structure provides for a bit line for the memory device is a specific embodiment.

Depending on the embodiment, there can be other applications. As described, resistive switching device using amorphous silicon material is based on an injection of metal particles from an electrode into a portion of the amorphous silicon material when a suitable voltage is applied. The metal particles can be in forms of ions or clusters to form a conductive region and a conductive path in the amorphous silicon material. If the conduction path or the metal particles in the amorphous silicon material can be made permanent and stable over time, an one time programmable OTP device can be formed.

Referring to FIG. 22, a switching device 2200 is provided. The switching device includes a first electrode 2202, a second electrode 2204, and a switching region 2206 formed between the first electrode and the second electrode. The switching region includes an amorphous silicon material in a specific embodiment. As an example, the first electrode can be a common metal material used in CMOS fabrication such as tungsten, aluminum, or copper. The first electrode can also be a doped silicon material depending on the application. The second electrode preferably has a portion that includes a metal material having a suitable diffusivity in amorphous silicon material. In certain implementation, the metal material is silver. Conventionally, an OTP device may be programmed by forming a metal region 2208 in an electroforming process. The metal region usually resides near the second electrode 2204 after electroforming process and thus not uniform in the switching material. The electroforming process includes applying a positive voltage to electrode 2204 in a specific embodiment. A voltage higher than an electroforming voltage is usually required or a long voltage pulse greater than a millisecond range is used to form a stable metal region. As the metal region is formed by diffusion of metal particles enhanced by an electric field, at a high voltage, the metal particles are caused to diffuse into the amorphous silicon material and form an open region near the top electrode, where only a few metal particles are present and not sufficient to form electrical connection with the second electrode.

Embodiments of the present invention provide a method for forming and programming an OTP device. The present method has the advantage of programming the OTP device at a low voltage (<<5 volts) and a stable device, among others.

Figure 23A:
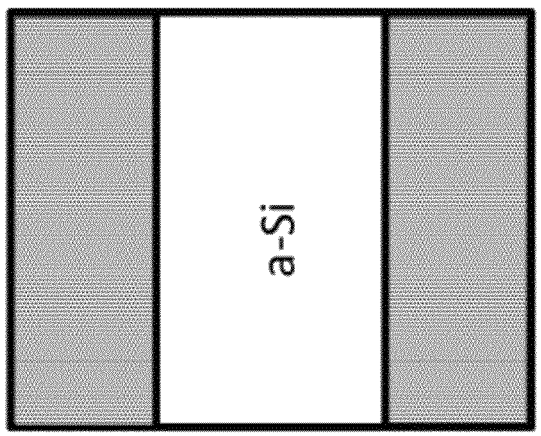
FIGS. 23(*a*), 23(*b*), and 23(*c*) are simplified diagram illustrating a method of programming an one time programmable device according to an embodiment of the present invention.
Figure 23B:
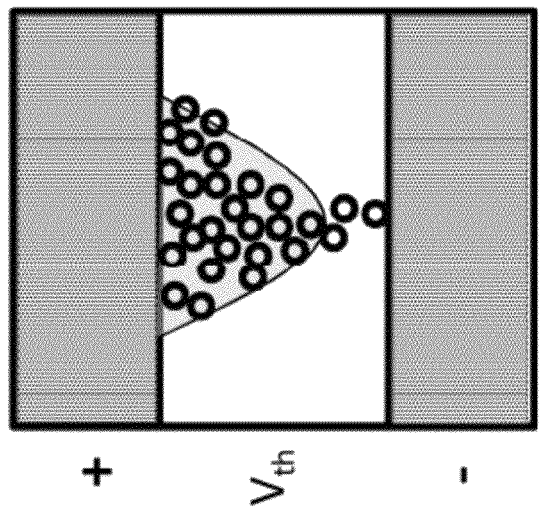
Figure 23C:
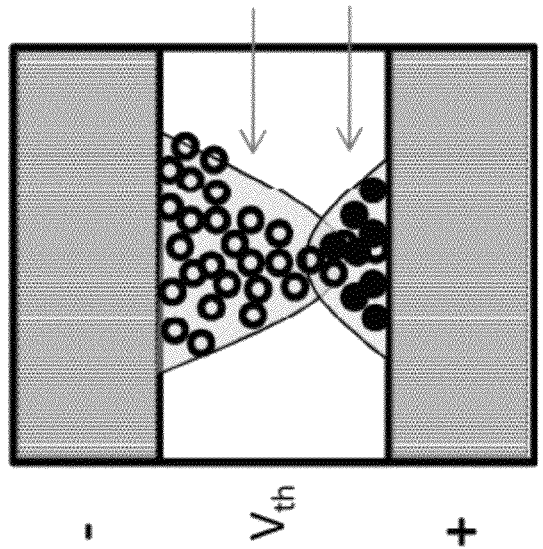

FIGS. 23(a), 23(b), and 23(c) are simplified diagrams illustrating formation of an OTP device according to an embodiment of the present invention. As shown in FIG. 23(a), an as fabricated switching according is provided. The as fabricated switching device includes a top electrode, a bottom electrode and an amorphous silicon switching layer. The as fabricated device is in a high resistant state. As shown in FIG. 23(b), when a forward bias voltage (for example, a positive voltage) greater than a threshold voltage is applied to the second electrode, a first metal region including a filament structure is formed in a portion of the amorphous silicon material in an electroforming process. The filament structure is characterized by a length and a distance between neighboring metal particles. In conventional switching, to program the switching device, the filament structure is caused to extend upon applying a second forward bias voltage to the second electrode. The filament structure retracts upon applying a reversed bias voltage to the second electrodes and the device is in an erased state.

To program an OTP device, a permanent metal region is allowed to form in the amorphous silicon material. As shown in FIG. 23(c), after forming the first metal region in the electroforming process, a reverse bias voltage applied to the second electrode causes a second metal region to form near the first electrode in a specific embodiment. The first electrode and the second electrode are selected such that the formation of the first metal region and the second metal region can occur at about the same amplitude of voltage and of different polarity of applied voltage in a specific embodiment. In a specific embodiment, after forming the first metal region, the threshold voltage to form the second metal region is reduced as an effective thickness of the amorphous silicon material is reduced in the presence of the first metal region.

Depending on the embodiment, the OTP device may be coupled with a NMOS or a PMOS as shown in FIG. 5.

As merely an example, the top electrode and the bottom electrode may be selected from: Ag, Au, Al, Pd, Pt, Ni, W, or Ti, among others. The threshold voltage for electroforming in amorphous silicon material is lowest for Ag and highest for Ti, depending on the deposition condition of the amorphous silicon material. The order of magnitude of electroforming voltage of the metal materials in amorphous silicon material is as follow:

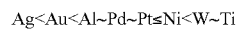

$Ag<Au<Al\sim Pd\sim Pt\leq Ni<W\sim Ti$

Depending on the application, the device configuration can have the same metal material for the top electrode and the bottom electrode or different metal materials for the top electrode and the bottom electrode. Additionally, amorphous silicon material can have a thickness less than about 100 nm to ensure stable and permanent metal regions for stable date storage and scalability. Of course one skilled in the art would recognize other modifications, variations, and alternatives.

Figure 24:
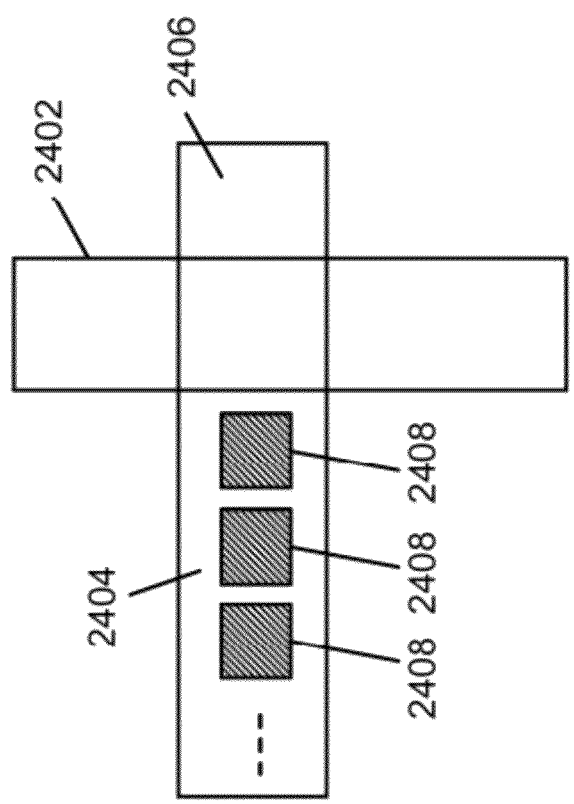
FIG. 24 is a simplified diagram illustrating a top view of a MOS device according to an embodiment of the present invention.

Depending on the application, there can be other variations. For example, more than one resistive switching device can be associated with one MOS device to form a 1TnR (one transistor n resistor) configuration. An example is provided in a top view in FIG. 24. As shown, a MOS device is provided. The MOS device includes a gate structure 2404, a first active region 2404, and a second active region 2406. The first active region can be a first impurity region and the second active region can be a second impurity region in a semiconductor substrate. As shown, more than one switching devices 2408 are formed overlying the first active region. Each of the switching devices can be implemented according to FIG. 3, 4, or 5. Each of the switching devices includes a respective bit line and operably coupled to the MOS device. Each of the switching devices can be independently selected or programmed using the MOS device in a specific embodiment. Alternatively, each of the switching devices may be configured as an one time programmable storage device and can be programmed or written as in FIGS. 23(a), 23(b), and 23(c). Of course one skilled in the art would recognized other variations, modifications, and alternatives.

In other embodiments, the present device and implementation can be formed using a vertical transistor. The vertical transistor includes a polysilicon gate or a metal gate overlying an impurity region in a semiconductor substrate. The polysilicon gate or the metal gate can provide for a bottom electrode for the switching devices embodied in the present application, further increase device density in a specific embodiment.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:
1. An integrated circuit device, comprising:
a semiconductor substrate having a surface region;
a gate dielectric layer overlying the surface region of the substrate;
a MOS device formed on the semiconductor substrate, the MOS device comprising a gate structure overlying the gate dielectric layer, a first active region, and a second active region, wherein the first active region forms a first electrode of a resistive switching device;

a dielectric layer formed on the MOS device, wherein the dielectric layer comprises a via exposing at least a portion of the first active region;

a resistive switching material formed within the via of the dielectric layer, the resistive switching material overlying and touching at least a portion of the first active region of the MOS device, wherein the resistive switching material formed within the via forms a switching media of the resistive switching device; and a second electrode material formed within the via of the dielectric layer, overlying and in contact with the resistive switching material formed within the via, the second electrode material comprising at least a conductive material, and wherein the second electrode material forms a second electrode of the resistive switching device.

2. The device of claim 1 wherein the MOS device is a select transistor for the resistive switching device.

3. The device of claim 1 wherein the MOS device further provides a variable resistor serially coupled to the resistive switching device to prevent excessive current to flow in the resistive switching device, the variable resistor having a resistance controlled by a voltage applied to the gate structure.

4. The device of claim 3 wherein the variable resistor further causes multi-level bit characteristic in the resistive switching device.

5. The device of claim 1 wherein the second electrode comprises aluminum metal in contact with the resistive switching material.

6. The device of claim 1 wherein the p-doped silicon material comprises a $p^+$ doped polysilicon material.

7. The device of claim 1 wherein the first active region and the second active region each has a P type impurity characteristic.

8. The device of claim 1 wherein the first active region and the second active region each has a N type impurity characteristic.

9. The device of claim 1 wherein the conductive material is selected from a group consisting of: silver, platinum, gold, and palladium.

10. The device of claim 1 wherein the switching material is characterized by a resistance dependent on a first voltage applied to the second electrode or a second voltage applied to the second active region.

11. The device of claim 1 wherein the resistive switching device is one of N (N>=1) resistive switching devices respectively coupled to the MOS device.

12. An integrated circuit device, comprising:
a semiconductor substrate having a surface region;
a gate dielectric layer overlying the surface region of the substrate;
a PMOS device formed on the semiconductor substrate, the PMOS device comprising a gate structure overlying the gate dielectric layer, a first $p^+$ active region, and a second $p^+$ active region;
a dielectric layer formed on the PMOS device, wherein the dielectric layer comprises a via exposing at least a portion of the first $p^+$ active region;
a resistive switching material formed within the via of the dielectric layer the resistive switching material overlying and in direct contact with the portion of the first $p^+$ active region, the resistive switching material comprising an amorphous silicon material;
a first electrode material formed within the via of the dielectric layer comprising at least a conductive material overlying the resistive switching material, the conductive material being in contact with the resistive switching material; and
a first conductor structure overlying the second active region.

13. The device of claim 12 wherein the first $p^+$ active region, the resistive switching region material in the via, and the first electrode material in the via forms a resistive switching device.

14. The device of claim 13 wherein the first $p^+$ active region forms a second electrode for the resistive switching device.

15. The device of claim 12 wherein the conductive material is selected from a group consisting of: silver, platinum, gold, palladium aluminum.

16. The device of claim 13 wherein the PMOS device is a select transistor for the resistive switching device.

17. The device of claim 13 wherein the PMOS device provides a variable resistor serially coupled to the resistive switching device.

18. The device of claim 12 wherein the resistive switching material is characterized by a resistance dependent on a first voltage applied to the first electrode or a second voltage applied to the second $p^+$ active region.

19. The device of claim 13 wherein the resistive switching device is one of N (N>=1) resistive switching devices respectively coupled to the PMOS device.

20. A method for forming an integrated circuit device, comprising:
providing a semiconductor substrate having a surface region;
forming a gate dielectric layer overlying the surface region of the semiconductor substrate;
forming a gate structure for a MOS device overlying the gate dielectric layer;
forming a first active region and a second active region for the MOS device in a vicinity of the surface region of the substrate comprising doped silicon material;
forming a dielectric layer material overlying the gate structure, the first active region and the second active region;
forming a via to expose a top surface of the first active region;
disposing a resistive switching layer material overlying at least a portion of the dielectric layer material, within the via and in direct contact with a portion of the first active region, wherein the resistive switching layer material comprises an amorphous silicon material;
disposing a first electrode layer material overlying the resistive switching layer material, within in the via, and in direct contact with the resistive switching layer material, wherein the first electrode layer material comprising at least a conductive material;
removing portions of the resistive switching layer material and the first electrode layer material external to the via, wherein a resistive switching device is formed from the first active region and portions of the first switching layer material and the first electrode layer material within the via; and
forming a first conductor structure overlying the second active region.

21. The method of claim 20 wherein the first active region and the second active region each has a $p^+$ impurity characteristic.

22. The method of claim 20 wherein the gate structure comprises a material selected from a group consisting of: polysilicon material, a silicide, and a metal material.

23. The method of claim 20 wherein the conductive material is selected from a group consisting of: silver, platinum, gold, palladium, aluminum.

24. The method of claim 20 wherein the first active region and the second active region further include a portion comprising a metal silicide material to reduce resistance of the first active region and the second active region.

25. The method of claim 20 wherein the first electrode is a bit line for the resistive switching device.

26. The method of claim 20 wherein the first active region forms a second electrode for the resistive switching device.

27. An integrated circuit device structure, comprising:
a semiconductor substrate having a surface region;
a gate dielectric layer overlying the surface region of the substrate;
a MOS device formed on the semiconductor substrate, the MOS device comprising a gate structure overlying the gate dielectric layer, a first active region, and a second active region, wherein the first active region comprising doped silicon material;
a dielectric layer formed on the MOS device, wherein the dielectric layer comprises a via exposing at least a portion of the first active region;
a resistive switching material formed within the via of the dielectric layer, the resistive switching material overlying and touching at least a portion of the first active region, wherein the resistive switching material comprises amorphous silicon material, the first active region forming a first electrode for a resistive switching device; and
a second electrode material formed within the via of the dielectric layer comprising at least a metal material overlying and in contact with the resistive switching material; and
a second conductor structure overlying the second active region;
wherein the portion of the first active region, resistive switching material formed within the via, and second electrode material formed within the via form a resistive switching device.

28. The device of claim 27 wherein the MOS device is a select transistor for the resistive switching device.

29. The device of claim 27 wherein the metal material comprises a metal material selected from a group consisting of: silver, gold, aluminum, palladium, platinum, nickel, tungsten, and titanium.

30. The device of claim 27 wherein the amorphous silicon material has a thickness within a range of about 20 nm to about 100 nm.

31. The device of claim 27 wherein the resistive switching device forms a one time programmable memory device.

32. The device of claim 27 wherein the metal material forms a first metal region in a first portion of the resistive switching material in a vicinity of the second electrode upon application of a positive voltage to the second electrode, wherein the first metal region causes a conductive path connecting the first electrode and the second electrode.

33. The device of claim 32 wherein the conductive path causes a low resistant state or an on state.

34. The device of claim 1 wherein the resistive switching device is configured to be repeatedly placed within a high-resistance state or an low-resistance state.

35. The device of claim 1 wherein the resistive switching device comprises an extendable and retractable filamentary-based resistive switching device.

36. The device of claim 1
wherein the first electrode comprises a metal conductor structure;
wherein the buffer layer comprises a $p^+$ doped polysilicon material; and
wherein the conductive material comprises silver.

37. The device of claim 12 wherein the resistive switching device is configured to be repeatedly placed within a high-resistance state or an low-resistance state.

38. The device of claim 12 wherein the resistive switching device comprises an extendable and retractable filamentary-based resistive switching device.

39. The device of claim 12
wherein the first $p^+$ active region comprises a $p^+$ doped polysilicon material; and
wherein the conductive material comprises silver.

40. The method of claim 20
wherein the conductive material comprises silver;
wherein the switching region comprises a plurality of defect regions, and
wherein the defect regions are configured to allow particles of silver to repeatedly form and retract therefrom.

41. The method of claim 20
resistive switching device is configured to be repeatedly placed within a high-resistance state or an low-resistance state.

42. The method of claim 27
wherein the second metal material comprises silver;
wherein the amorphous silicon material comprises a plurality of defect regions, and
wherein the defect regions are configured to allow particles of silver to repeatedly form and retract therefrom.

43. The method of claim 27
wherein the resistive switching device is configured to be repeatedly placed within a high-resistance state or an low-resistance state.

* * * * *